US006559693B2

(12) United States Patent
Tung et al.

(10) Patent No.: US 6,559,693 B2
(45) Date of Patent: May 6, 2003

(54) INTEGRATED CIRCUIT DESIGNS FOR HIGH SPEED SIGNAL PROCESSING

(76) Inventors: John C. Tung, 20975 Valley Green Dr., Suite 293, Cupertino, CA (US) 95014; Minghao Zhang, 20975 Valley Green Dr., Suite 293, Cupertino, CA (US) 95014

( * ) Notice: Subject to any disclaimer, the term of this patent is extended or adjusted under 35 U.S.C. 154(b) by 0 days.

(21) Appl. No.: 10/137,988

(22) Filed: May 2, 2002

(65) Prior Publication Data

US 2003/0048117 A1 Mar. 13, 2003

Related U.S. Application Data

(63) Continuation-in-part of application No. 09/947,643, filed on Sep. 5, 2001, now Pat. No. 6,433,595.

(51) Int. Cl.[7] .............................................. H03K 21/00

(52) U.S. Cl. ...................................... 327/115; 327/218

(58) Field of Search ........................... 327/113–115, 117, 327/200, 201, 208, 210–215, 218, 219; 377/47

(56) References Cited

U.S. PATENT DOCUMENTS

| 5,844,437 A | * | 12/1998 | Asazawa et al. ............ 327/202 |
| 5,945,858 A | * | 8/1999 | Sato ............................ 327/202 |
| 6,140,845 A | * | 10/2000 | Benachour ..................... 327/57 |
| 6,166,571 A | * | 12/2000 | Wang .......................... 327/115 |
| 6,489,811 B2 | * | 12/2002 | Jenkins ........................ 326/115 |

OTHER PUBLICATIONS

Sharaf & Elmasry, "Analysis and optimization of series—Gated CML and ECL high–speed bipolar circuits, " IEEE Journal on Solid–state circuits, vol. 31, No. 2, Feb. 1996, pp. 202–211.

* cited by examiner

Primary Examiner—My-Trang Nu Ton
(74) Attorney, Agent, or Firm—Joe Zheng

(57) ABSTRACT

Techniques designing an electronic circuit system including multiple transistors and passive components are presented. According to one aspect of the techniques, some or all of the transistors and passive components are systematically adjusted to minimize artifacts resulting from system-level interactions among these functional building blocks. The adjustment is based on a ratio of Electrically Equivalent Channel Geometry (EECG) of each of the adjusted the transistors and passive components.

20 Claims, 9 Drawing Sheets

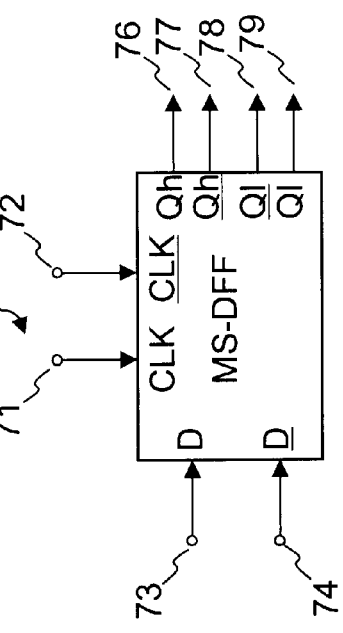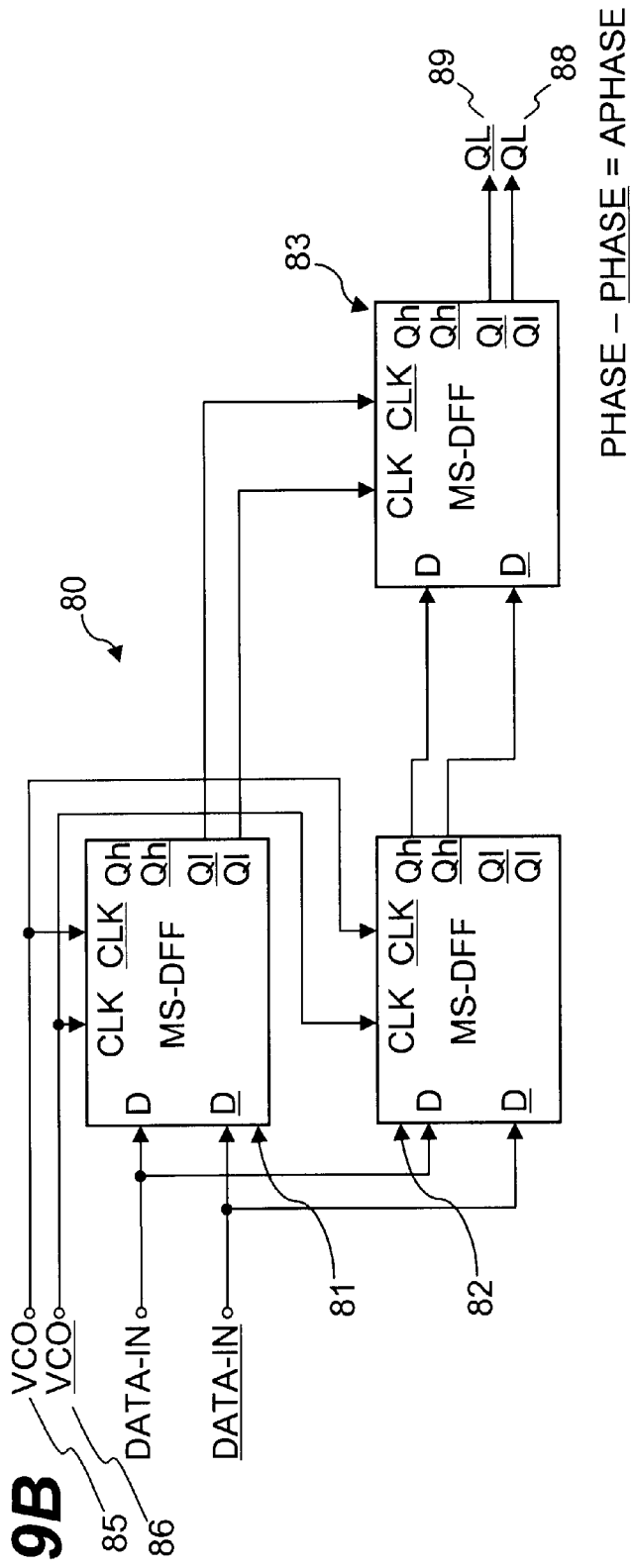
Fig. 9A
Fig. 9B

INTEGRATED CIRCUIT DESIGNS FOR HIGH SPEED SIGNAL PROCESSING

CROSS REFERENCE TO RELATED APPLICATIONS

This application is a continuation-in-part application of U.S. application Ser. No.: 09/947,643, filed Sep. 5, 2001, now U.S. Pat. No. 6,433,595, and entitled "Method of System Circuit Design and Circuitry for High Speed Data Communication" and U.S. application Ser. No.: 10/136,165, filed Apr. 30, 2002, and entitled "A 2-Level Series-Gated CML-Based Circuit With Inductive Components For Optical Communication".

BACKGROUND OF THE INVENTION

The present invention relates generally to the field of data communication. More particularity, the present invention concerns a generic design methodology of a new family of Complementary Metal Oxide Semiconductor (CMOS) Integrated Circuits (IC). Thus, its direct applications include a variety of subsystem and system functions such as Master Slave D-type Flip Flop (MS-DFF), Divider, Bang Bang Phase Detector (BBPD), Frequency Detection (FD), Phase and Frequency Detection (PFD), Voltage Controlled Oscillator (VCO) and Phase Locked Loop (PLL) in an optical switch IC for data communications. Optical Fiber has been used in voice and data communication for some time now due to its high bandwidth and excellent signal quality resulting from its immunity to electromagnetic interference. The inherent optical data rate from a modulated single-mode laser beam travelling through an optical fiber is expected to well exceed 1000 Gbit/sec.

However, short of a completely optical communication system, the practically realizable bandwidth of fiber optical communication systems has been limited by the need of signal conversion between optical and electrical domain and the associated electronics hardware. With the usage of CMOS ICs, the advantages of low manufacturing cost, low operating power consumption, low supply voltage requirement and fairly good circuit density are realized while achieving a moderate speed capability. To fully realize the speed capability of CMOS IC at the circuit system level with good output signal quality, U.S. Pat. No.: 6,433,595 teaches a method of systematically adjusting an Electrically Equivalent Channel Geometry (EECG) of some or all of the individual CMOS transistors within each of the otherwise topologically similar building blocks. Using this method, a maximum operating clock frequency of approximately 12 GHz is realizable when the IC is implemented with a 0.18 $\mu$m CMOS Silicon wafer process. Further U.S. application Ser. No.: 10/136,165 teaches the inclusion of inductive components into a fundamental building block of 2-level series-gated Current Mode Logic (CML)-based Field Effect Transistor (FET) circuit for an electronic circuit system for optical communication to achieve a higher load-driving capacity under a much higher operating frequency of up to 50 GHz.

In practice, a circuit may include other components such as resistive and inductive components. Therefore, there is a need for techiques of designing other components in an IC system to reach a much higher operating clock frequency while maintaining good output signal quality.

SUMMARY OF THE INVENTION

The present invention is directed to a new family of high speed CMOS ICs including both resistive and inductive circuit components and a corresponding generic design methodology.

One of the objects of this invention is to provide a generic design methodology for a family of ICs including, in addition to the active transistors, both resistive and inductive circuit components while maintaining good output signal quality.

Other object, together with the foregoing are attained in the exercise of the invention in the following description and resulting in the embodiment illustrated in the accompanying drawings.

BRIEF DESCRIPTION OF DRAWINGS

The current invention will be better understood with regard to the following description, appended claims, and accompanying drawings where:

FIG. 9A is a logic functional block representation of the MS-DFF of FIG. 8;

FIG. 9B is a logic functional block diagram of a typical BBPD using the MS-DFF of FIG. 9A as its logic building block;

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessary obscuring aspects of the present invention. The detailed description is presented largely in terms of logic blocks and other symbolic representations that directly or indirectly resemble the operations of signal processing devices coupled to networks. These descriptions and representations are the means used by those experienced or skilled in the art to most effectively convey the substance of their work to others skilled in the art.

Reference herein to "one embodiment" or an "embodiment" means that a particular feature, structure, or characteristics described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations of the invention.

Figure 1:
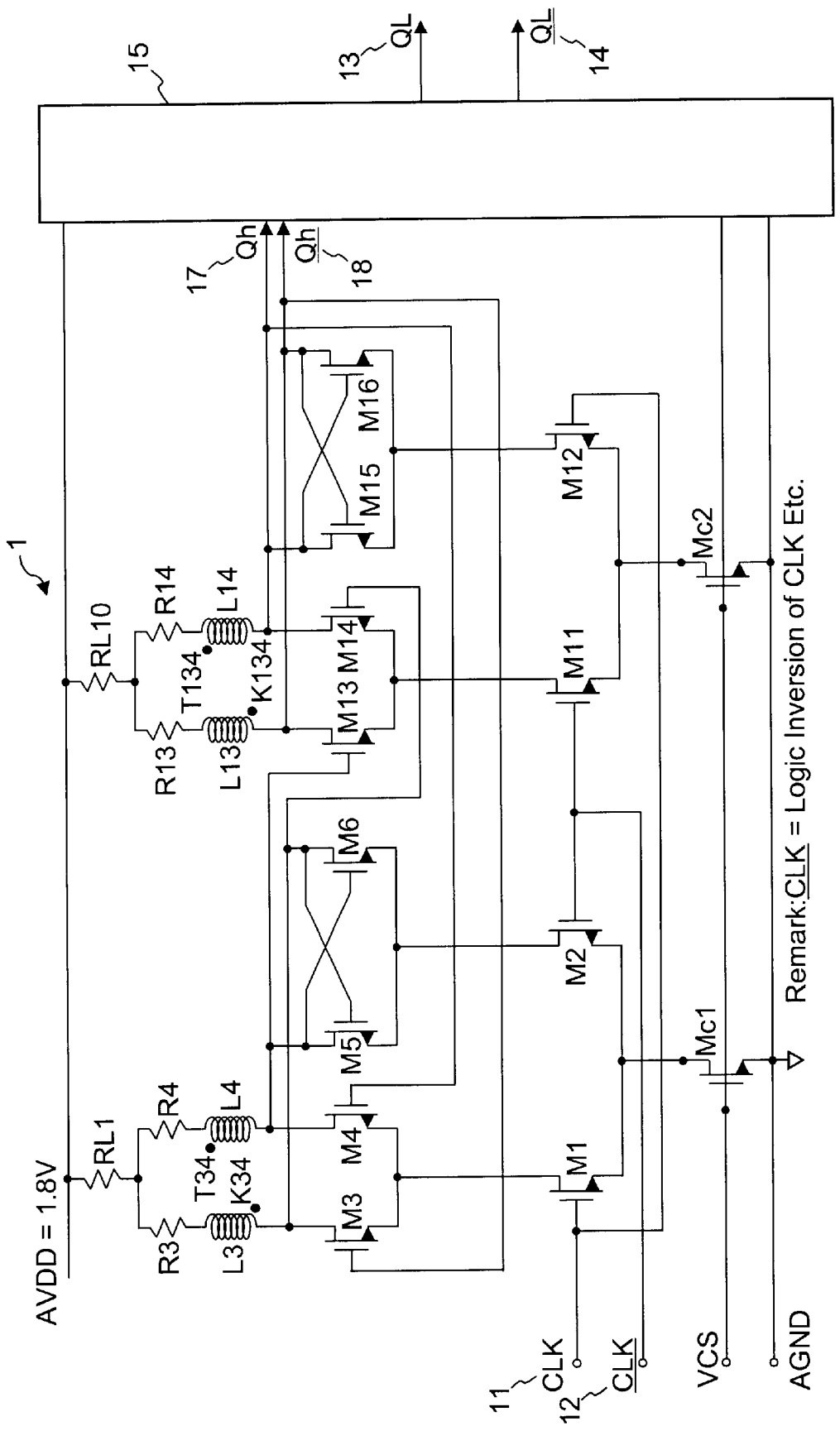
FIG. 1 shows, according to one embodiment of the present invention, a circuit architecture of a Divide-by-2 divider with current mode switching wherein both resistive and inductive circuit components are used.

FIG. 1 shows a circuit architecture of a Divide-by-2 DIVIDER 1 with current mode switching. To facilitate the description of the present invention, FIG. 1 is based on CMOS circuitry. In this embodiment, the supply voltage AVDD is shown 1.8 Volt although other values could be used, for example 2.5 Volt. AGND designates "analog ground" and VCS is a bias voltage applied to the gates of transistors Mc1 and Mc2 to set tip a corresponding amount of source current flowing through them. Through DIVIDER 1, the frequency of a differential signal between CLK 11 and CLK12 will be divided in half into the differential signal between Qh 17 and Qh18. The differential signals Qh 17 and Qh18 are then buffeted through an Output Buffer 15, whose details are not shown here to avoid obscuring aspects of the present invention, to become the differential signal between QL 13 and QL14. The various active transistors (e.g. NMOS) are designated as Mc1, Mc2, M1, M2, . . . and M16. The four pull-up resistors are designated as R3, R4, R13 and R14. Each of the two resistors RL1 and RL10 performs a simple function of voltage level shifting. As explained in U.S. application Ser. No.: 10/136,165, the added inductive components L3, L4, L13 and L14, together with their formed transformers T34 and T134 of respective coupling coefficients K34 and K134, enable the DIVIDER 1 to achieve a higher operating frequency while providing a higher load-driving capacity. Further, U.S. Application Ser. No. 09/947,643 teaches a method of systematically adjusting an Electrically Equivalent Channel Geometry (EECG) of all the individual CMOS transistors within each of the otherwise topologically similar building blocks. Therefore, the present invention proposes to adjust the functionally relevant electrical parameters of each or all of the active and passive circuit components of the otherwise topologically similar building blocks. This can be illustrated with a first embodiment of a Divide-by-16 circuit system having four Divide-by-2 building blocks.

Figure 2A:
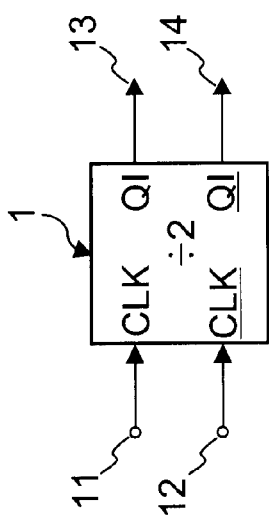
FIG. 2A shows a logic functional block representation of the Divide-by-2 divider of FIG. 1.
Figure 2B:
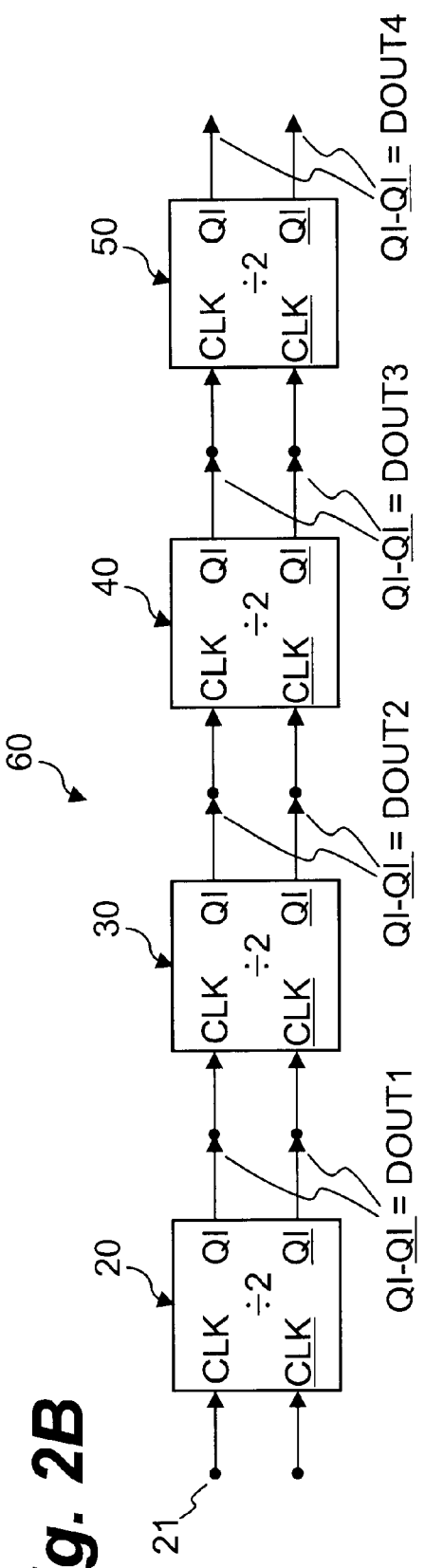
FIG. 2B is a logic functional block diagram of a Divide-by-16 divider using the Divide-by-2 divider of FIG. 1.

FIG. 2A shows a logic functional block representation of the Divide-by-2 divider of FIG. 1. FIG. 2B is a logic functional block diagram of a Divide-by-16 DIVIDER 60 using the Divide-by-2 divider from FIG. 2A as its logic building block. Specifically, the replicated logic building blocks are labeled as DIVIDER 20, DIVIDER 30, DIVIDER 40 and DIVIDER 50. For those skilled in the art, it can be easily seen that the frequency of INPUT CLOCK 21 gets divided by two (2) as a differential signal QL–QL=DOUT1 at the output of DIVIDER 20. Likewise, the frequency of INPUT CLOCK 21 gets divided by four (4) as a differential signal QL–QL=DOUT2 at the output of DIVIDER 30. The frequency of INPUT CLOCK 21 gets divided by eight (8) as a differential signal QL–QL=DOUT3 at the output of DIVIDER 40. Finally, the frequency of INPUT CLOCK 21 gets divided by sixteen (16) as a differential signal QL–QL=DOUT4 at the output of DIVIDER 50.

It is well known in the art that, at the IC-design level for a given wafer process, the conductance of a transistor is primarily determined by the following parameter:

W/L, where W=channel width and L=channel length.

For convenience, the following parameter is defined:

Electrically Equivalent Channel Geometry (EECG)=W/L.

To conveniently describe the functionally relevant and adjustable electrical parameters of some or all the components in a building block within a circuit system, an Electrically Equivalent Component Parameter (EECP) is defined as follows:

EECP of a resistor=its resistance value;

EECP of an inductive component=its inductance value;

EECP of a transformer formed with coupled inductive components=a vector quantity consisting of the individual inductance value and the coupling coefficient between the inductive components;

EECP of a capacitive component=its capacitance value; and

EECP of an transistor=its EECG.

Given the above definition and as a result of the present invention, the detailed quantitative designs of the four Divide-by-2 building blocks of DIVIDER 20, DIVIDER 30, DIVIDER 40 and DIVIDER 50 of the Divide-by-16 DIVIDER 60 are arrived and shown in the following TABLE-1A, TABLE-1B, TABLE-1C and TABLE-1D:

TABLE 1A

Design of EECP for DIVIDER 20

| Component | EECP | Unit | RATIO of EECP |
| --- | --- | --- | --- |
| R3 | 25 | Ohm | 1.667 |
| R4 | 25 | Ohm | 1.667 |
| R13 | 15 | Ohm | 1.000 |
| R14 | 15 | Ohm | 1.000 |
| L3 | 250 | Picohenry | 16.667 |
| L4 | 250 | Picohenry | 16.667 |
| L13 | 180 | Picohenry | 12.000 |
| L14 | 180 | Picohenry | 12.000 |
| K34 | 0.5 | dimensionless | 0.033 |
| K134 | 0.5 | dimensionless | 0.033 |
| MC1 | 260 | dimensionless | 17.333 |
| MC11 | 260 | dimensionless | 17.333 |
| M1 | 160 | dimensionless | 10.667 |
| M2 | 160 | dimensionless | 10.667 |
| M11 | 160 | dimensionless | 10.667 |
| M12 | 160 | dimensionless | 10.667 |
| M3 | 120 | dimensionless | 8.000 |
| M4 | 120 | dimensionless | 8.000 |
| M5 | 170 | dimensionless | 11.333 |
| M6 | 170 | dimensionless | 11.333 |
| M13 | 140 | dimensionless | 9.333 |
| M14 | 140 | dimensionless | 9.333 |
| M15 | 170 | dimensionless | 11.333 |
| M16 | 170 | dimensionless | 11.333 |

TABLE 1B

Design of EECP for DIVIDER 30

| Component | EECP | Unit | RATIO of EECP |
| --- | --- | --- | --- |
| R3 | 90 | Ohm | 1.500 |
| R4 | 90 | Ohm | 1.500 |
| R13 | 60 | Ohm | 1.000 |
| R14 | 60 | Ohm | 1.000 |
| L3 | 850 | Picohenry | 14.167 |
| L4 | 850 | Picohenry | 14.167 |
| L13 | 750 | Picohenry | 12.500 |
| L14 | 750 | Picohenry | 12.500 |
| K34 | 0.5 | dimensionless | 0.008 |
| K134 | 0.5 | dimensionless | 0.008 |
| MC1 | 240 | dimensionless | 4.000 |
| MC11 | 240 | dimensionless | 4.000 |
| M1 | 120 | dimensionless | 2.000 |
| M2 | 120 | dimensionless | 2.000 |
| M11 | 120 | dimensionless | 2.000 |
| M12 | 120 | dimensionless | 2.000 |

TABLE 1B-continued

Design of EECP for DIVIDER 30

| Component | EECP | Unit | RATIO of EECP |
|---|---|---|---|
| M3 | 150 | dimensionless | 2.500 |
| M4 | 150 | dimensionless | 2.500 |
| M5 | 180 | dimensionless | 3.000 |
| M6 | 180 | dimensionless | 3.000 |
| M13 | 140 | dimensionless | 2.333 |
| M14 | 140 | dimensionless | 2.333 |
| M15 | 160 | dimensionless | 2.667 |
| M16 | 160 | dimensionless | 2.667 |

TABLE 1C

Design of EECP for DIVIDER 40

| Component | EECP | Unit | RATIO of EECP |
|---|---|---|---|
| R3 | 200 | Ohm | 0.667 |
| R4 | 200 | Ohm | 0.667 |
| R13 | 300 | Ohm | 1.000 |
| R14 | 300 | Ohm | 1.000 |
| L3 | 0 | Picohenry | 0.000 |
| L4 | 0 | Picohenry | 0.000 |
| L13 | 0 | Picohenry | 0.000 |
| L14 | 0 | Picohenry | 0.000 |
| K34 | 0 | dimensionless | 0.000 |
| K134 | 0 | dimensionless | 0.000 |
| MC1 | 240 | dimensionless | 0.800 |
| MC11 | 240 | dimensionless | 0.800 |
| M1 | 100 | dimensionless | 0.333 |
| M2 | 100 | dimensionless | 0.333 |
| M11 | 100 | dimensionless | 0.333 |
| M12 | 100 | dimensionless | 0.333 |
| M3 | 80 | dimensionless | 0.267 |
| M4 | 80 | dimensionless | 0.267 |
| M5 | 90 | dimensionless | 0.300 |
| M6 | 90 | dimensionless | 0.300 |
| M13 | 80 | dimensionless | 0.267 |
| M14 | 80 | dimensionless | 0.267 |
| M15 | 90 | dimensionless | 0.300 |
| M16 | 90 | dimensionless | 0.300 |

TABLE 1D

Design of EECP for DIVIDER 50

| Component | EECP | Unit | RATIO of EECP |
|---|---|---|---|
| R3 | 250 | Ohm | 1.000 |
| R4 | 250 | Ohm | 1.000 |
| R13 | 250 | Ohm | 1.000 |
| R14 | 250 | Ohm | 1.000 |
| L3 | 0 | Picohenry | 0.000 |
| L4 | 0 | Picohenry | 0.000 |
| L13 | 0 | Picohenry | 0.000 |
| L14 | 0 | Picohenry | 0.000 |
| K34 | 0 | dimensionless | 0.000 |
| K134 | 0 | dimensionless | 0.000 |
| MC1 | 180 | dimensionless | 0.720 |
| MC11 | 180 | dimensionless | 0.720 |
| M1 | 80 | dimensionless | 0.320 |
| M2 | 80 | dimensionless | 0.320 |
| M11 | 80 | dimensionless | 0.320 |
| M12 | 80 | dimensionless | 0.320 |
| M3 | 100 | dimensionless | 0.400 |
| M4 | 100 | dimensionless | 0.400 |
| M5 | 150 | dimensionless | 0.600 |
| M6 | 150 | dimensionless | 0.600 |
| M13 | 100 | dimensionless | 0.400 |
| M14 | 100 | dimensionless | 0.400 |
| M15 | 150 | dimensionless | 0.600 |
| M16 | 150 | dimensionless | 0.600 |

To facilitate the understanding of the present invention, the following examples from TABLE-1A, the design of EECP for the DIVIDER 20, are provided to appreciate some of the table entries:

Design of EECP:

Resistor R3=25 Ohm

Resistor R14=15 Ohm

Inductive component L13=180 Picohenry ($10^{-12}$ henry)

Inductive component L14=180 Picohenry ($10^{-12}$ henry)

K134=coupling coefficient between L13 and L14=0.5 (dimensionless)

Transistor Mc1 has an EECG of 260 (dimensionless)

Transistor M1 has an EECG of 160 (dimensionless)

Thus, the corresponding "RATIO of EECP" is given by:

25:15:180:180:0.5:260:160=
1.667:1.000:12.000:12.000:0.033:17.333:10.667

In arriving at the above RATIO of EECP, a choice of using the EECP of R14 as a common divisor is made. It is remarked that this choice is arbitrary for as long as the resulting RATIO of EECP falls within a convenient range for easy presentation of the inventive concept. It may be noted that, while there is a general absence of EECP for a capacitive component in the above tables, for those skilled in the art, it should be understood that the adjustment of EECP for numerous capacitive components have already been implicitly included in the present invention. This is due to the presence of inherent capacitance components among the gate, the source, the drain and the bulk of any transistors within a building block and the EECP of these capacitance components would vary according to the adjustment of EECG for each particular transistor under consideration. It may be observed from the above tables that each of the DIVIDERS 20, 30, 40 and 50 has a set of RATIOS and further, one set of RATIOS for a DIVIDER (e.g. 20) is different from another set of RATIOS for another DIVIDER (e.g., 60). As used herein, a set of the RATIOS is referred to as a Common Factor (CF), being defined as a ratio matrix or ratio vector (if all ratios are arranged in a column). Accordingly, as one of the features in the present invention, one CF for one DIVIDER (e.g., 20) is made different from one CF for another DIVIDER (e.g., 60).

Figure 3:
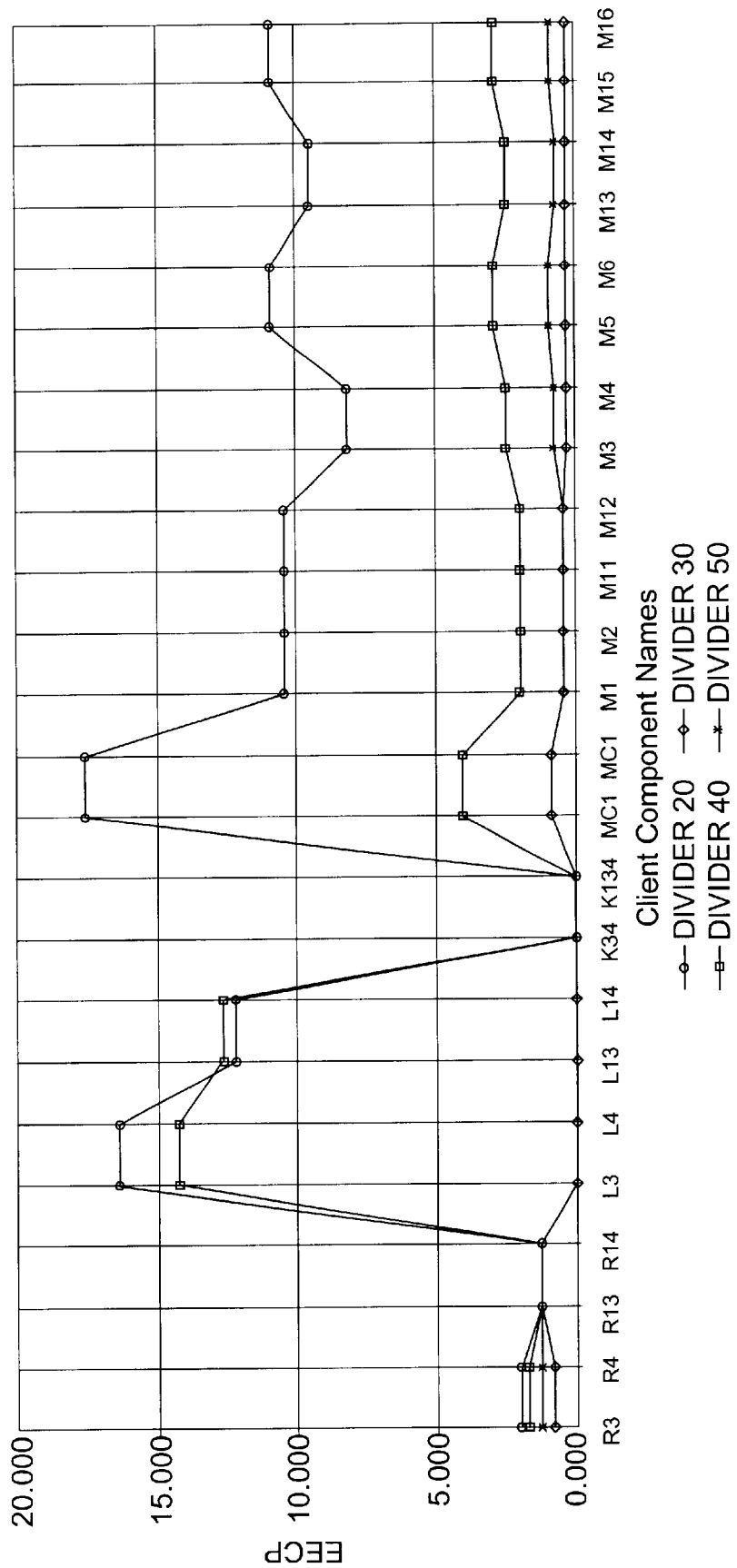
FIG. 3 graphically details the quantitative design of the Divide-by-2 building blocks of the Divide-by-16 divider of FIG. 2B.
Figure 4:
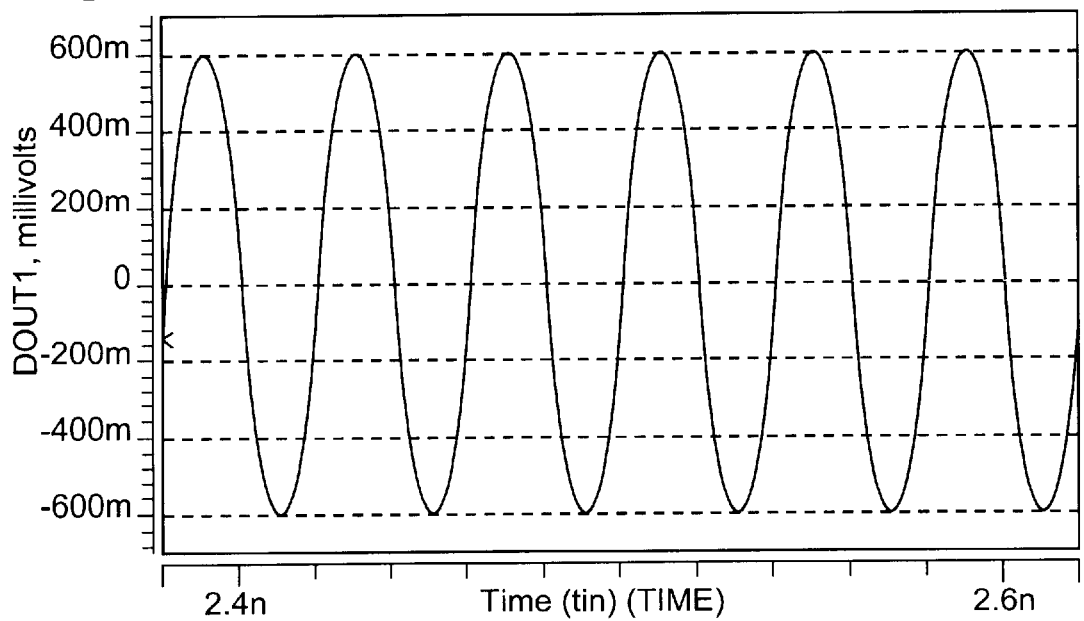
FIG. 4 through FIG. 7 successively depicts an output signal quality of the four Divide-by-2 dividers of the Divide-by-16 divider of FIG. 2B.
Figure 5:
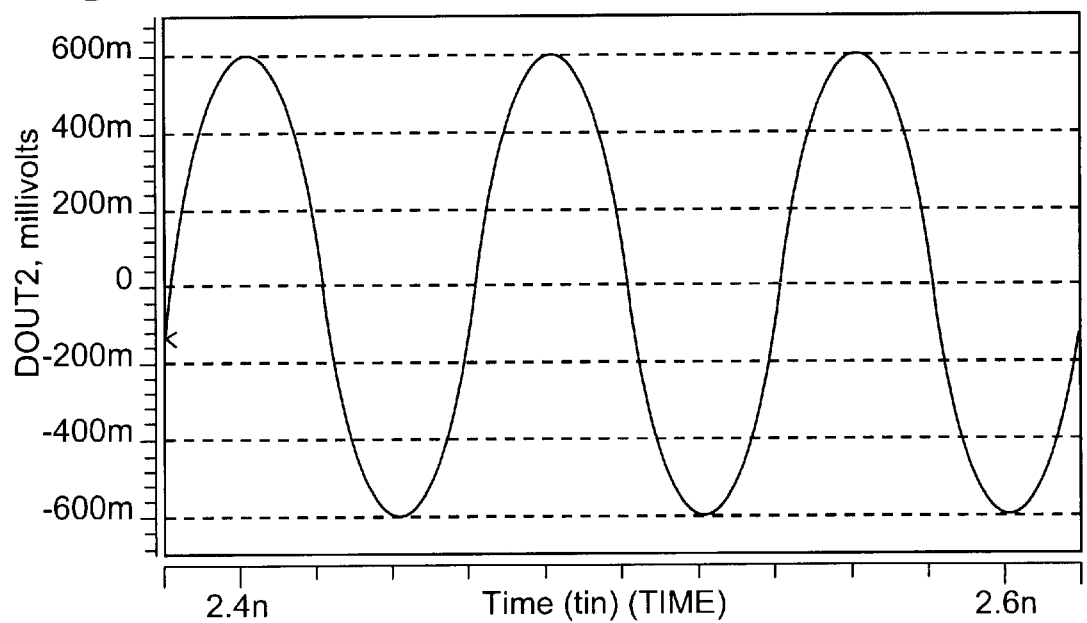
Figure 6:
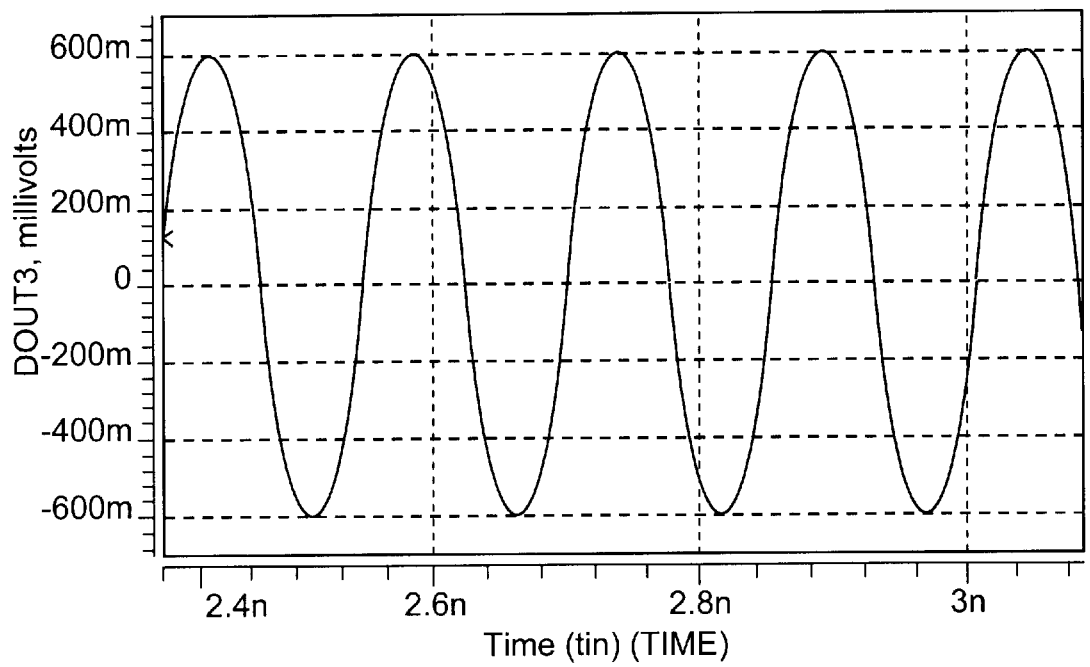
Figure 7:
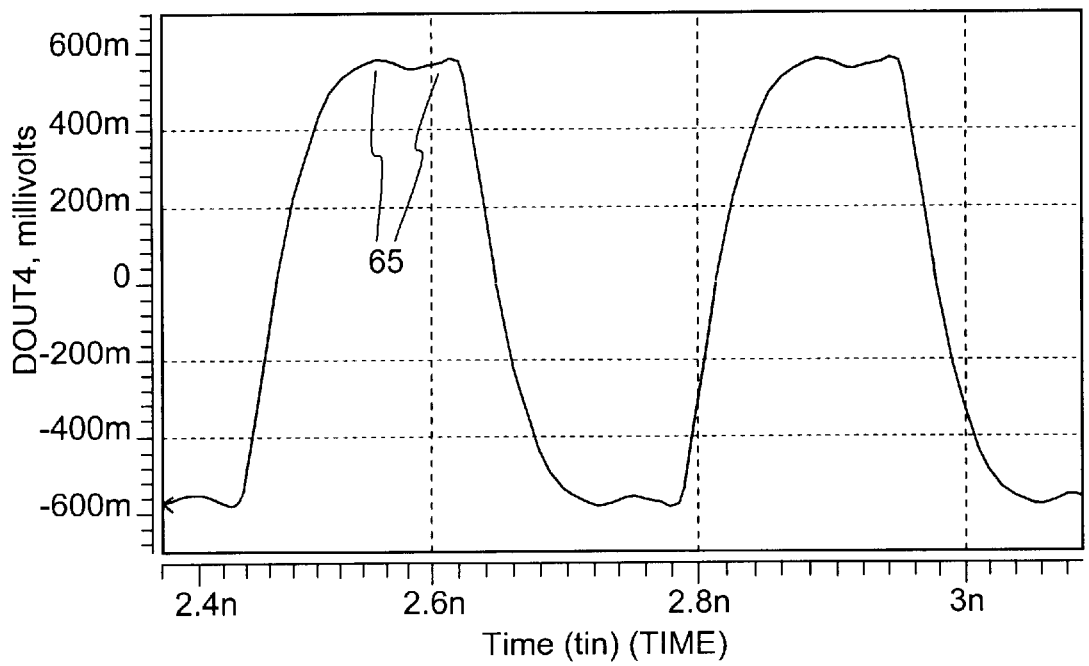

TABLE-1E summarizes a design overview of the Divide-by-16 DIVIDER 60 according to one embodiment of the present invention. Among the four Divide-by-2 building blocks of DIV1 (DIVIDER 20), DIV2 (DIVIDER 30), DIV3 (DIVIDER 40) and DIV4 (DIVIDER 50), the four columns of "RATIO of EECP" are all different and they are further graphically illustrated in FIG. 3. The corresponding output waveforms, given an INPUT CLOCK 21 frequency of 50 GHz, from DIVIDER 20, DIVIDER 30, DIVIDER 40 and DIVIDER 50 are respectively shown in FIG. 4, FIG. 5, FIG. 6 and FIG. 7. Except for a slight signal distortion 65 from DIVIDER 50 (FIG. 7), the rest of the output waveforms (FIG. 4, FIG. 5 and FIG. 6) exhibit no visible distortion.

TABLE 1E

Overview of Design of EECP for DIVIDER 60

| Component | RATIO of EECP DIV1 | RATIO of EECP DIV2 | RATIO of EECP DIV3 | RATIO of EECP DIV4 |
|---|---|---|---|---|
| R3 | 1.667 | 1.500 | 0.667 | 1.000 |
| R4 | 1.667 | 1.500 | 0.667 | 1.000 |
| R13 | 1.000 | 1.000 | 1.000 | 1.000 |
| R14 | 1.000 | 1.000 | 1.000 | 1.000 |
| L3 | 16.667 | 14.167 | 0.000 | 0.000 |
| L4 | 16.667 | 14.167 | 0.000 | 0.000 |
| L13 | 12.000 | 12.500 | 0.000 | 0.000 |
| L14 | 12.000 | 12.500 | 0.000 | 0.000 |
| K34 | 0.033 | 0.008 | 0.000 | 0.000 |
| K134 | 0.033 | 0.008 | 0.000 | 0.000 |
| MC1 | 17.333 | 4.000 | 0.800 | 0.720 |
| MC11 | 17.333 | 4.000 | 0.800 | 0.720 |
| M1 | 10.667 | 2.000 | 0.333 | 0.320 |
| M2 | 10.667 | 2.000 | 0.333 | 0.320 |
| M11 | 10.667 | 2.000 | 0.333 | 0.320 |
| M12 | 10.667 | 2.000 | 0.333 | 0.320 |
| M3 | 8.000 | 2.500 | 0.267 | 0.400 |
| M4 | 8.000 | 2.500 | 0.267 | 0.400 |
| M5 | 11.333 | 3.000 | 0.300 | 0.600 |
| M6 | 11.333 | 3.000 | 0.300 | 0.600 |
| M13 | 9.333 | 2.333 | 0.267 | 0.400 |
| M14 | 9.333 | 2.333 | 0.267 | 0.400 |
| M15 | 11.333 | 2.667 | 0.300 | 0.600 |
| M16 | 11.333 | 2.667 | 0.300 | 0.600 |

Figure 8:
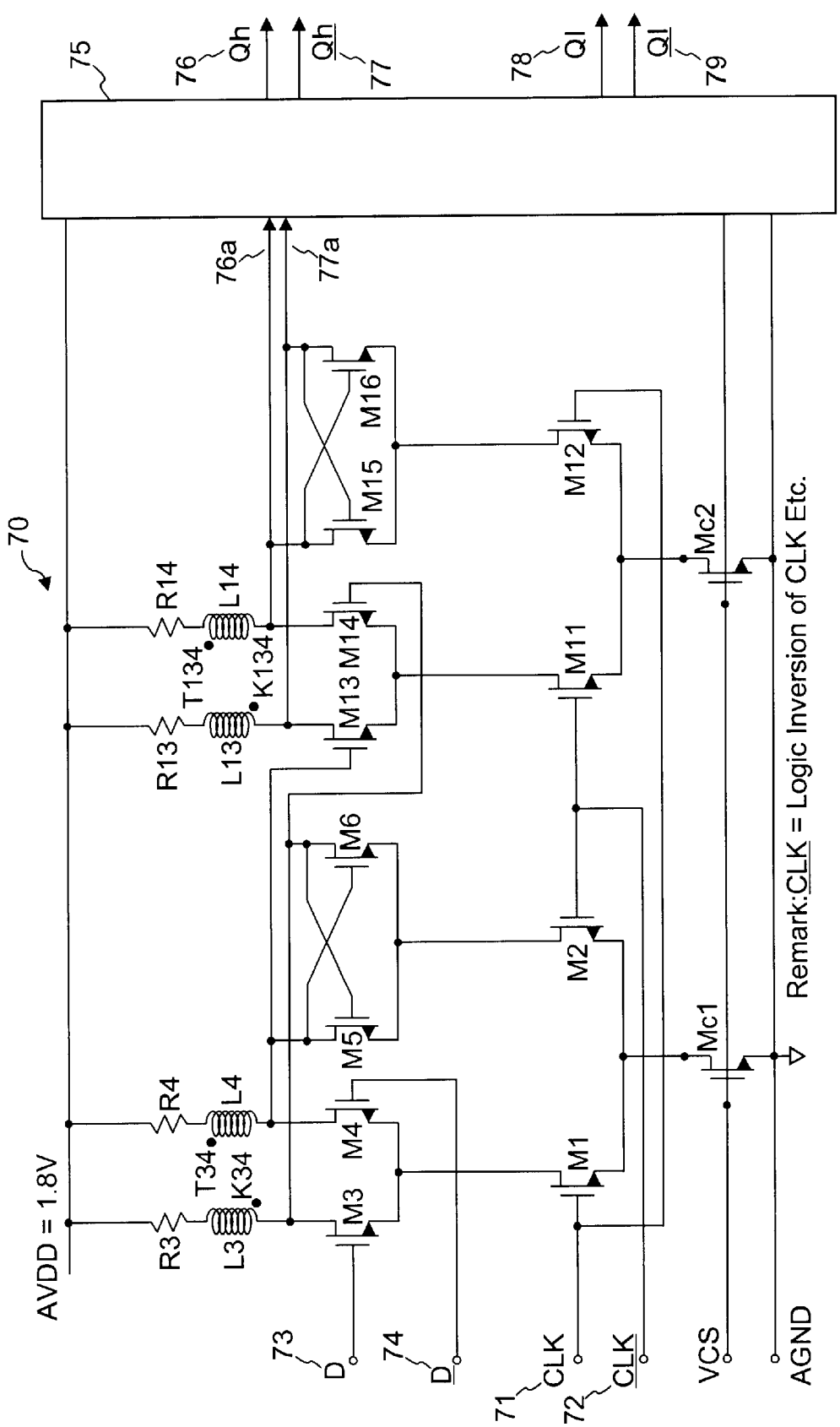
FIG. 8 shows a circuit architecture of an MS-DFF with current mode switching wherein both resistive and inductive circuit components are used.

According to another embodiment of the current invention, FIG. 8 and FIG. 9A show a typical circuit architecture of an MS-DFF 70 with current mode switching and its associated logic functional block representation. In this embodiment, the supply voltage AVDD is shown to be 1.8 Volt although other values could be used, for example 2.5 Volt. The input clock signals are CLK 71 and CLK72. The input data signals are D 73 and D74. The pre-output differential signals 76a and 77a are then buffered through an Output Buffer 75 to become the output differential signal pairs (Qh 76, Qh77) and (QI 78, QI79). The various active NMOS transistors are designated as Mc1, Mc2, M1, M2, . . ., and M16. The four pull-up resistors are designated R3, R4, R13 and R14. Like before, the added inductive components L3, L4, L13 and L14, together with their formed transformers T34 and T134 of respective coupling coefficients K34 and K134, expect to enable the MS-DFF 70 to achieve a higher operating frequency while providing a higher load-driving capacity. Similarly, the embodiment proposes to adjust the EECPs of some or all the active and passive circuit components of the otherwise topologically similar building blocks. This can be illustrated with an exemplary Bang Bang Phase Detector (BBPD) circuit having three MS-DFF building blocks.

FIG. 9B is a logic functional block diagram of a typical BBPD 80 using the MS-DFF 70 from FIG. 9A as its logic building block. Specifically, the replicated logic building blocks are labeled as MS-DFF 81, MS-DFF 82 and MS-DFF 83. The input signals include VCO 85 and DATA-IN 86. The output signals include a PHASE 88 and PHASE89. For those skilled in the art, it can be seen that the logic state of PHASE 88 and PHASE89 will change according to the phase relationship of leading or lagging between the two input signals VCO 85 and DATA-IN 86. For convenience, the following differential signal is also defined:

$$\Delta PHASE = PHASE - \underline{PHASE}.$$

Like before, while using the same circuit architecture of an MS-DFF 70 with current mode switching as the building blocks, a system level design of BBPD 80, by virtue of the present invention, yields a high level of output signal quality especially for high VCO frequency commonly used in optical communications. This is illustrated, in a manner similar to the first exemplary case of DIVIDER 60, for a BBPD 80 of VCO 85 frequency=40 GHz and DATA-IN 86 date rate=41.66 Gbit/sec with TABLE-2A, TABLE-2B and TABLE-2C below:

TABLE 2A

Design of EECP for MS-DFF 81

| Component | EECP | Unit | RATIO of EECP |
|---|---|---|---|
| R3 | 150 | Ohm | 1.000 |
| R4 | 150 | Ohm | 1.000 |
| R13 | 150 | Ohm | 1.000 |
| R14 | 150 | Ohm | 1.000 |
| L3 | 700 | Picohenry | 4.667 |
| L4 | 700 | Picohenry | 4.667 |
| L13 | 700 | Picohenry | 4.667 |
| L14 | 700 | Picohenry | 4.667 |
| K34 | 0.5 | dimensionless | 0.003 |
| K134 | 0.5 | dimensionless | 0.003 |
| MC1 | 260 | dimensionless | 1.733 |
| MC11 | 260 | dimensionless | 1.733 |
| M1 | 200 | dimensionless | 1.333 |
| M2 | 200 | dimensionless | 1.333 |
| M11 | 200 | dimensionless | 1.333 |
| M12 | 200 | dimensionless | 1.333 |
| M3 | 90 | dimensionless | 0.600 |
| M4 | 90 | dimensionless | 0.600 |
| M5 | 70 | dimensionless | 0.467 |
| M6 | 70 | dimensionless | 0.467 |
| M13 | 90 | dimensionless | 0.600 |
| M14 | 90 | dimensionless | 0.600 |
| M15 | 70 | dimensionless | 0.467 |
| M16 | 70 | dimensionless | 0.467 |

TABLE 2B

Design of EECP for MS-DFF 82

| Component | EECP | Unit | RATIO of EECP |
|---|---|---|---|
| R3 | 150 | Ohm | 1.000 |
| R4 | 150 | Ohm | 1.000 |
| R13 | 150 | Ohm | 1.000 |
| R14 | 150 | Ohm | 1.000 |
| L3 | 500 | Picohenry | 3.333 |
| L4 | 500 | Picohenry | 3.333 |
| L13 | 500 | Picohenry | 3.333 |
| L14 | 500 | Picohenry | 3.333 |
| K34 | 0.5 | dimensionless | 0.003 |
| K134 | 0.5 | dimensionless | 0.003 |
| MC1 | 260 | dimensionless | 1.733 |
| MC11 | 260 | dimensionless | 1.733 |
| M1 | 200 | dimensionless | 1.333 |
| M2 | 200 | dimensionless | 1.333 |
| M11 | 200 | dimensionless | 1.333 |
| M12 | 200 | dimensionless | 1.333 |
| M3 | 70 | dimensionless | 0.467 |
| M4 | 70 | dimensionless | 0.467 |
| M5 | 90 | dimensionless | 0.600 |
| M6 | 90 | dimensionless | 0.600 |
| M13 | 70 | dimensionless | 0.467 |
| M14 | 70 | dimensionless | 0.467 |
| M15 | 90 | dimensionless | 0.600 |
| M16 | 90 | dimensionless | 0.600 |

TABLE 2C

Design of EECP for MS-DFF 83

| Component | EECP | Unit | RATIO of EECP |
|---|---|---|---|
| R3 | 160 | Ohm | 1.000 |
| R4 | 160 | Ohm | 1.000 |
| R13 | 160 | Ohm | 1.000 |
| R14 | 160 | Ohm | 1.000 |
| L3 | 0 | Picohenry | 0.000 |
| L4 | 0 | Picohenry | 0.000 |
| L13 | 0 | Picohenry | 0.000 |
| L14 | 0 | Picohenry | 0.000 |
| K34 | 0 | dimensionless | 0.000 |
| K134 | 0 | dimensionless | 0.000 |
| MC1 | 240 | dimensionless | 1.500 |
| MC11 | 240 | dimensionless | 1.500 |
| M1 | 100 | dimensionless | 0.625 |
| M2 | 100 | dimensionless | 0.625 |
| M11 | 100 | dimensionless | 0.625 |
| M12 | 100 | dimensionless | 0.625 |
| M3 | 120 | dimensionless | 0.750 |
| M4 | 120 | dimensionless | 0.750 |
| M5 | 180 | dimensionless | 1.125 |
| M6 | 180 | dimensionless | 1.125 |
| M13 | 120 | dimensionless | 0.750 |
| M14 | 120 | dimensionless | 0.750 |
| M15 | 180 | dimensionless | 1.125 |
| M16 | 186 | dimensionless | 1.125 |

Figure 10:
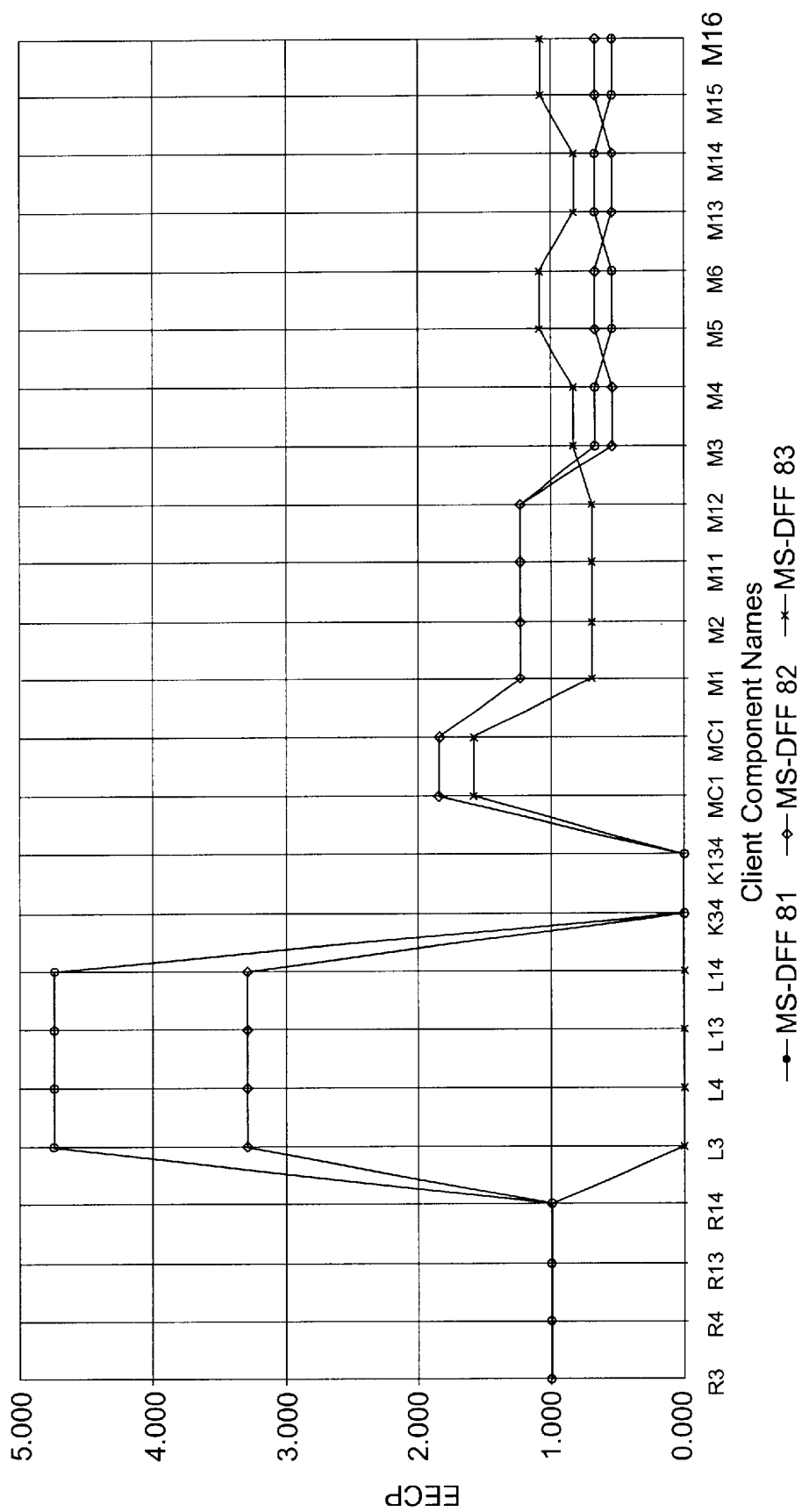
FIG. 10 graphically details the quantitative design of the MS-DFF building blocks of the BBPD of FIG. 9B.
Figure 11:
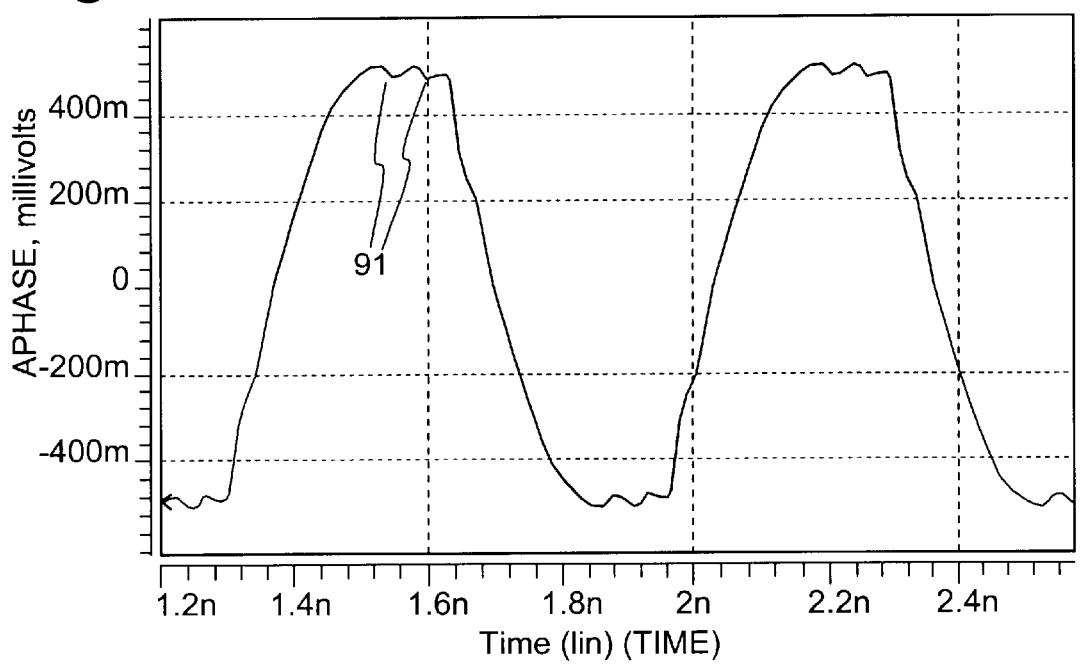
FIG. 11 depicts the output signal quality of the BBPD of FIG. 9B.

Similarly, TABLE-2D summarizes a design overview of the BBPD 80 according to one embodiment of the present invention. It may be noticed that, among the three MS-DFF building blocks of MS-DFF 81, MS-DFF 82, and MS-DFF 83, the three columns of "RATIO of EECP" are all different and they are further graphically illustrated in FIG. 10. The corresponding output waveform of $\Delta$PHASE is shown in FIG. 11. Again, except for a slight signal ripple 91, the output waveform exhibits nearly perfect performance for phase detection.

TABLE 2D

Overview of Design of Design of EECP for BBPD 80

| Component | RATIO of EECP MS-DFF81 | RATIO of EECP MS-DFF82 | RATIO of EECP MS-DFF83 |
|---|---|---|---|
| R3 | 1.000 | 1.000 | 1.000 |
| R4 | 1.000 | 1.000 | 1.000 |
| R13 | 1.000 | 1.000 | 1.000 |
| R14 | 1.000 | 1.000 | 1.000 |
| L3 | 4.667 | 3.333 | 0.000 |
| L4 | 4.667 | 3.333 | 0.000 |
| L13 | 4.667 | 3.333 | 0.000 |
| L14 | 4.667 | 3.333 | 0.000 |
| K34 | 0.003 | 0.003 | 0.000 |
| K134 | 0.003 | 0.003 | 0.000 |
| MC1 | 1.733 | 1.733 | 1.500 |
| MC11 | 1.733 | 1.733 | 1.500 |
| M1 | 1.333 | 1.333 | 0.625 |
| M2 | 1.333 | 1.333 | 0.625 |
| M11 | 1.333 | 1.333 | 0.625 |
| M12 | 1.333 | 1.333 | 0.625 |
| M3 | 0.600 | 0.467 | 0.750 |
| M4 | 0.600 | 0.467 | 0.750 |
| M5 | 0.467 | 0.600 | 1.125 |
| M6 | 0.467 | 0.600 | 1.125 |
| M13 | 0.600 | 0.467 | 0.750 |
| M14 | 0.600 | 0.467 | 0.750 |
| M15 | 0.467 | 0.600 | 1.125 |
| M16 | 0.467 | 0.600 | 1.125 |

Thus, with the present invention, the quantitative design of all the passive and active circuit components of each building block of BBPD 80 is individually adjusted to achieve a high level of output signal quality in the presence of such deteriorating effects like output loading and interaction between functionally connected building blocks. Furthermore, these effects tend to become especially pronounced at high VCO frequencies such as those for high speed optical communications presented here.

As described with two exemplary cases, by systematically adjusting the EECP of all the passive and active circuit components of the individual building blocks of an electronic circuit system, one can achieve a high quality of output signal. This is especially important for applications with high clock frequency such as in optical communications where such effects of output loading and interaction between functionally connected building blocks tend to become highly pronounced. The invention has been described using exemplary preferred embodiments. However, for those skilled in this field, the preferred embodiments can be easily adapted and modified to suit additional applications without departing from the spirit and scope of this invention. For example, the present invention can be applied to a more generalized electronic circuit system using Field Effect Transistors (FET), Bipolar transistors or other types of transistors. Given the description herein, those skilled in the art can appreciate that the methodology of circuit design in the present invention, dealing with the minimization of systems level interaction effects amongst the various building blocks, is clearly independent of the particular geometry of the wafer process for the fabrication of the related IC, be it 0.25 $\mu$m, 0.18 $\mu$m or 0.09 $\mu$m. In fact, the methodology of the present invention is naturally scalable with the geometry of the wafer process as it continues its miniaturization process following the well known Moore's Law achieving a correspondingly higher speed of operation. Some of the related applications include, but without limitation to, Optical communications at 2.5 Gbit/sec (OC48), 10 Gbit/sec (OC192) and 40 Gbit/sec (OC768) data rate, Gigabit Ethernet, 10 Gigabit Ethernet, Blue Tooth technology (2.4 GHz) and wireless LAN (5.2 GHz). With the present invention, the hardware infrastructure for a high-speed data processing becomes possible.

Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

What is claimed is:

1. An integrated circuit for high speed signal processing, the integrated circuit comprising:
    a first difference circuit receiving an input signal having a frequency,
    a second difference circuit coupled to the first difference circuit, each of the first and second difference circuits including a number of transistors, two resistors and two inductive components, each of the two inductive components coupled to one of the two resistors, each of the transistors associated with a value of an Electrically Equivalent Channel Geometry (EECG) controlling an electrical current through the each of the transistors, and each of the transistors, the resistors and the inductive components associated with an Electrically Equivalent Component Parameter (EECP);
    wherein a ratio for each of the transistors, the resistors and the inductive components is determined to be the EECP of the each of the transistors, the resistors and the inductive components over the EECP of a chosen one of the each of the transistors, the resistors and the inductive components;

wherein the ratio for each of the transistors, the resistors and the inductive components is adjusted in reference to the frequency of the input signal so that a first ratio set including the ratio for each of the transistors, the resistors and the inductive components in the first difference circuit is different from a second ratio set including the ratio for each of the transistors, the resistors and the inductive components in the second difference circuit.

2. The integrated circuit of claim 1, wherein the transistors, the resistors and the inductive components inherently create one or more capacitance components such that various parasitic effects are created.

3. The integrated circuit of claim 2, wherein the parasitic effects are optimized by adjusting either one or both of the first and the second ratio set.

4. The integrated circuit of claim 2, wherein the parasitic effects are optimized to minimize possible artifacts in an output from the first or second difference circuit.

5. The integrated circuit of claim 1, wherein the two inductive components in the first difference circuit are arranged next to each other to form a first transformer; and the two inductive components in the second difference circuit are arranged next to each other to form a second transformer.

6. The integrated circuit of claim 5, wherein the first ratio set includes a ratio for the first transformer and the second ratio set includes a ratio for the second transformer.

7. The integrated circuit of claim 5, wherein the EECG for each of the transistors in the first and second difference circuits is assigned to be the EECP for the each of the transistors in the first and second difference circuits.

8. The integrated circuit of claim 1, wherein the transistors in both of the first and second difference circuits are CMOS transistors, Bipolar transistors, or Field Effect Transistors.

9. An integrated circuit system for high speed signal processing, the integrated circuit system comprising:

at least a first and a second building blocks, each of the two building blocks including:
a number of transistors, resistors and inductive components, each of the transistors associated with a value of an Electrically Equivalent Channel Geometry (EECG) controlling an electrical current through the each of the transistors, and each of the transistors, the resistors and the inductive components associated with an Electrically Equivalent Component Parameter (EEGP);

wherein a ratio for each of the transistors, the resistors and the inductive components is determined to be the EECP of the each of the transistors, the resistors and the inductive components over the EECP of a chosen one of the each of the transistors, the resistors and the inductive components; and when the first building block receives an input signal having a frequency, the ratio for each of the transistors, the resistors and the inductive components in the first building block is adjusted in reference to the frequency so that one or more capacitance components are inherently formed to create parasitic effects.

10. The integrated circuit system of claim 9, wherein the parasitic effects used to minimize possible artifacts in an output from the first building block.

11. The integrated circuit system of claim 10, wherein the frequency is so high that the parasitic effects are utilized to keep minimum artifacts in an output from the first building block.

12. The integrated circuit system of claim 11, wherein the first and the second building blocks are coupled, the second adjustable building block receives the output from the first building block, the ratio for each of the transistors, the resistors and the inductive components in the second building block is so adjusted that a second output signal therefrom has minimum artifacts introduced in the second building block.

13. The integrated circuit system of claim 9, wherein either one of the first and the second building blocks includes a first difference circuit coupled to a second difference circuit, each of the difference circuits including some of the transistors, the resistors and a transformer formed by two of the inductive components.

14. The integrated circuit system of claim 13, wherein the ratio for each of at least some of the transistors, the resistors and the inductive components in the first building block is made differently from the ratio for each of corresponding ones of the transistors, the resistors and the inductive components in the second building block.

15. A method for designing an integrated circuit for high speed signal processing, the method comprising:

determining a frequency in an input signal to be received at a first difference circuit, providing a second difference circuit coupled to the first difference circuit, each of the first and second difference circuits including a number of transistors, two resistors and two inductive components, each of the two inductive components coupled to one of the two resistors, each of the transistors associated with a value of an Electrically Equivalent Channel Geometry (EECG) controlling an electrical current through the each of the transistors;

determining an Electrically Equivalent Component Parameter (EECP) for each of the transistors, the resistors and the inductive components in the first and second difference circuits;

determining a ratio for each of the transistors, the resistors and the inductive components, wherein the ratio is determined to be the EECP of the each of the transistors, the resistors and the inductive components over the EECP of a chosen one of the each of the transistors, the resistors and the inductive components; and adjusting the ratio for each of the transistors, the resistors and the inductive components in reference to the frequency so that one or more capacitance components are inherently created to form various parasitic effects.

16. The method of claim 15, wherein the parasitic effects are utilized to minimize possible artifacts in an output from the first or the second difference circuit.

17. The method of claim 15, wherein the two inductive components in the first difference circuit are arranged next to each other to form a first transformer; and the two inductive components in the second difference circuit are arranged next to each other to form a second transformer.

18. The method of claim 17, wherein the first ratio set includes a ratio for the first transformer and the second ratio set includes a ratio for the second transformer.

19. The method of claim 15, wherein the EECG for each of the transistors in the first and second difference circuits is assigned to be the EECP for the each of the transistors in the first and second difference circuits.

20. The method of claim 15, wherein the transistors in both of the first and second difference circuits are CMOS transistors, Bipoloar transistors, or Field Effect Transistors.

* * * * *

UNITED STATES PATENT AND TRADEMARK OFFICE
CERTIFICATE OF CORRECTION

PATENT NO. : 6,559,693 B2
DATED : May 6, 2003
INVENTOR(S) : John C. Tung and Minghao Zhang Page 1 of 1

It is certified that error appears in the above-identified patent and that said Letters Patent is hereby corrected as shown below:

<u>Column 11,</u>
Lines 2 and 53, delete "the each of".

<u>Column 12,</u>
Line 42, delete "the each of".

Signed and Sealed this

Seventh Day of October, 2003

JAMES E. ROGAN
*Director of the United States Patent and Trademark Office*